United States Patent [19]
Heck

[11] Patent Number: 4,837,853
[45] Date of Patent: Jun. 6, 1989

[54] DUAL PORT FM DEMODULATION IN PHASE LOCKED RECEIVERS

[75] Inventor: Joseph P. Heck, Ft. Worth, Tex.

[73] Assignee: Motorola, Inc., Schaumburg, Ill.

[21] Appl. No.: 58,411

[22] Filed: Jun. 5, 1987

[51] Int. Cl.$^4$ ............................ H04B 1/16; H04B 1/12
[52] U.S. Cl. ..................................... 455/208; 455/209; 455/305; 455/260; 329/112
[58] Field of Search ............... 455/208, 209, 260, 263, 455/303, 305; 375/80, 81, 97; 329/112, 122

[56] References Cited

U.S. PATENT DOCUMENTS

| | | | |
|---|---|---|---|
| 3,961,262 | 6/1976 | Gassmann | 455/208 X |
| 4,166,251 | 8/1979 | Ishigaki et al. | 455/303 X |
| 4,472,685 | 9/1984 | Dutasta | 455/260 X |
| 4,653,117 | 3/1987 | Heck | 455/209 |
| 4,718,113 | 1/1988 | Rother et al. | 455/209 |

*Primary Examiner*—Robert L. Griffin
*Assistant Examiner*—Ralph E. Smith
*Attorney, Agent, or Firm*—Melvin A. Schechtman; Steven G. Parmelee

[57] ABSTRACT

FM receivers for communications at UHF frequencies often use automatic frequency control (AFS) or phase lock to precisely control a local oscillator. By causing the local oscillator to track errors and slow variations in the frequency of the received signal, these control loops suppress DC and low-frequency modulation components in the intermediate frequency signal and interfere with demodulation of low frequency information, such as digital signalling data. This invention permits recovery of the full modulation spectrum with flat frequency response. A conventional FM demodulator recovers the high frequency modulation components; the frequency control signal for the local oscillator provides the low frequency components. Combining the components with proper weighting produces recovered modulation with bandwidth limited only by the IF bandpass filter of demodulator. The invention would find application in an FM receiver of the superheterodyne or direct conversion type that requires precise frequency control, such as one used for communications in a narrow channel spacing environment at ultra-high frequencies.

8 Claims, 3 Drawing Sheets

DUAL PORT FM DEMODULATION IN PHASE LOCKED RECEIVERS

BACKGROUND OF THE INVENTION

1. Technical Field of the Invention

This invention pertains to frequency modulation (FM) radio receivers and in particular to FM receivers that use automatic frequency control (AFC) or phase lock to control a local oscillator.

2. Description of the Prior Art

Present two-way FM radio communications systems, with closely spaced channels at ultra-high frequencies (UHF), place stringent requirements on radio receivers. One requirement is for stable, accurate frequency determining elements; another is for narrow selectivity. To meet these requirements, most receivers use a local oscillator to convert the incoming signal to a frequency at which it is easier to obtain selectivity and gain than at the carrier frequency. In the superheterodyne method, the local oscillator frequency differs from that of the incoming signal by an amount equal to an intermediate frequency (IF); in the direct conversion method, the oscillator frequency equals the carrier frequency, which places the IF at baseband, or "zero-frequency."

After conversion, FM receivers usually amplify and limit the IF signal and demodulate it with a frequency discriminator or modulation tracking phase locked loop (PLL). A direct conversion receiver may demodulate at baseband or may retranslate the signal to a second IF for conventional demodulation. See, for example, *Dual Conversion FM Receiver using Phase Locked Direct Conversion IF,* U.S. Pat. No. 4,653,117, issued Mar. 24, 1987.

Closely-spaced channels require receivers to have narrow bandpass IF filters to reject adjacent channel interference and to obtain good sensitivity. Frequency tolerances in both the local oscillator and the received signal can allow the generated IF signal to fall outside the passband of the narrow filter. At UHF frequencies of 800 MHz and above, an error of only 2 parts-per-million (ppm) in the transmitted frequency could cause ±1.6 kHz error. The local oscillator could have similar tolerance and result in several kilohertz net frequency error at the IF. With the filter bandwidths required for 12.5 kHz channel spacing, errors of several kilohertz make it impractical to center the received signal in the IF filter passband without using additional frequency control means.

Among the prior art frequency control methods are automatic frequency control (AFC) and phase lock. AFC uses feedback from a frequency sensitive detector, such as a discriminator, to adjust the local oscillator to minimize IF frequency error at the detector caused by static offsets or slow variations in the frequency of the received carrier. Imperfections in the frequency detector or DC offsets in the control loop allow minor IF frequency errors, but these may be tolerable for many applications. Phase lock control uses feedback from a phase sensitive detector, which compares the IF signal with a stable reference and drives the local oscillator, to produce a constant IF difference frequency from the LO mixing with the received signal.

In tracking variations of the carrier frequency, local oscillator control loops interfere with demodulation of low-frequency FM information, which resides in instantaneous variations of the carrier frequency. Demodulation circuits expect these variations to be present after the carrier is translated to the IF, but the control loops remove modulation components having frequencies within their loop bandwidths. The severity of this problem depends on the frequency content of the modulation signals and on the bandwidth of the control loop. Typically, FM radio communications systems avoid modulation at DC, which requires shifts in the carrier frequency that are indistinguishable from static frequency errors. However, some signals, such as digital signalling data, may have modulation components at 10 Hertz or less.

The bandwidth required of the control loop depends on the speed with which the receiver must tune to a received signal and convert it to the IF. For example, the receiver may use a synthesized local oscillator to scan channels. Upon command, the receiver will tune its local oscillator to the frequency required to convert a received signal on a particular channel into the IF. The synthesizer produces approximately the correct frequency; then, the control loop further adjusts the LO to center the IF signal. This process may take place in less than a few milliseconds and require control loop bandwidth of more than 200 Hz. AFC systems are generally slower, but even they may be required to correct within fractions of a second when the received signal has a short duration.

Thus, a problem arises in attempting to recover low frequency FM components in receivers using wide bandwidth tracking loops. Wide loop bandwidths are desirable for rapid signal acquisition but interfere with demodulation of low frequency FM components, such as those produced by digital signalling data. It has been impractical to obtain lower frequency demodulation by decreasing loop bandwidth, because doing so reduces the ability of the radio to rapidly tune to channel.

SUMMARY OF THE INVENTION

The invention applies to FM receivers that use automatic means to control a local oscillator frequency to produce a predetermined intermediate frequency signal, and it allows such receivers to demodulate low frequency FM signals without the difficulties experienced in the prior art as described above. The invention is to demodulate the IF signal by conventional means and recover the high frequency components of the FM information; to derive the low frequency modulation components from the means for controlling the local oscillator; and to combine the low and high frequency components with proper weighting to produce recovered modulation having flat frequency response from DC to an upper limit determined only by the bandwidth of the IF bandpass filter or demodulator.

BRIEF DESCRIPTION OF THE DRAWINGS

The invention is better understood by reference to the accompanying Drawings, in which.

DESCRIPTION OF THE PREFERRED EMBODIMENT

Figure 1:
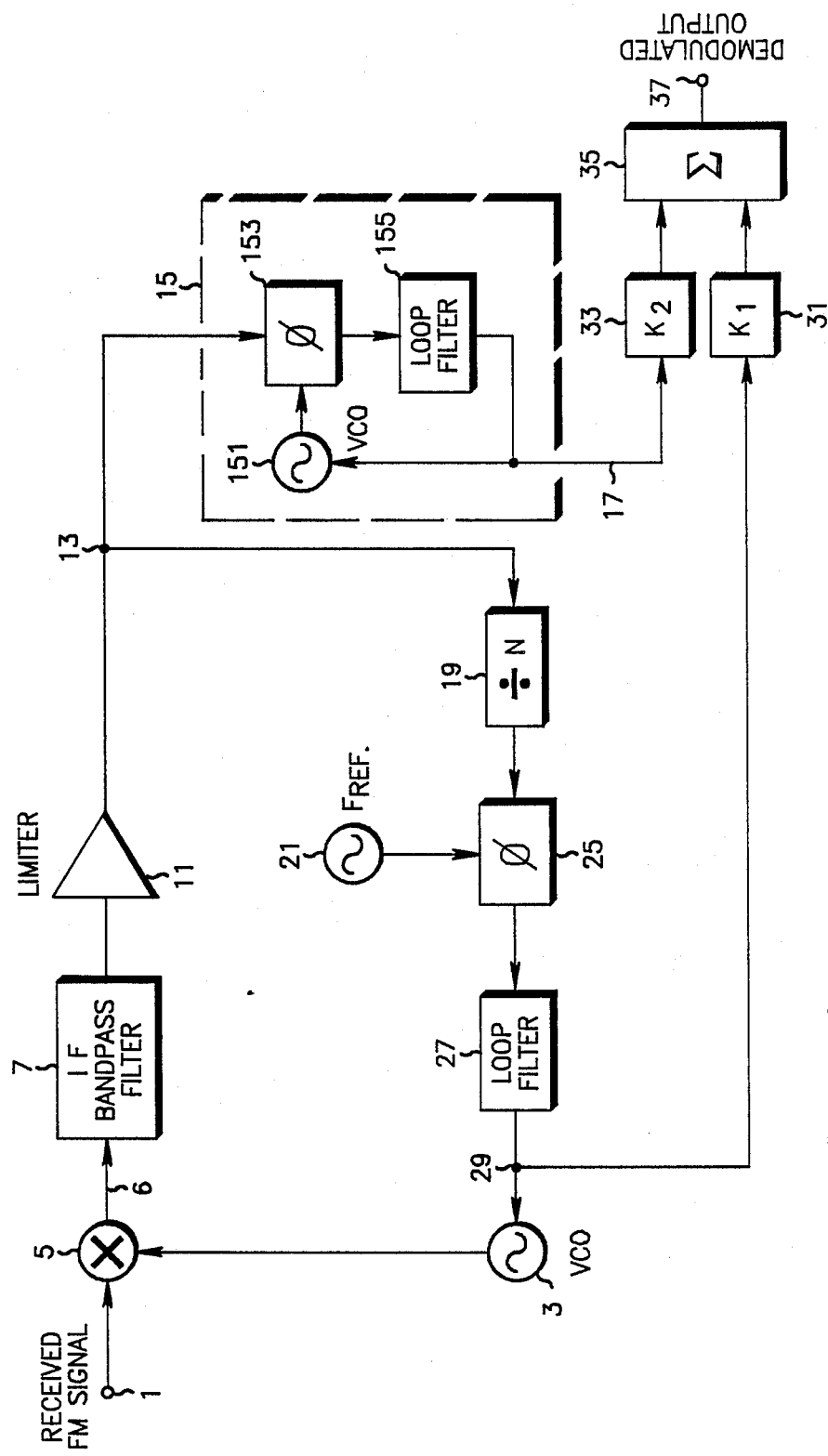
FIG. 1 is a block diagram of an FM receiver that includes a phase-locked local oscillator and that recovers modulation according to the principles of the invention.

FIG. 1 is a block diagram of a single-conversion FM receiver that demodulates according to the invention. To better focus on the invention, this simplified receiver shows neither an RF amplifier stage nor a preselector for protection against image frequency signals, either of which could be included as necessary for the intended operating environment. A local oscillator (LO) signal from voltage controlled oscillator (VCO) 3 converts the received FM signal at 1 in mixer 5 to an intermediate frequency (IF). If signal 6 goes through IF bandpass filter 7, which provides the selectivity of the receiver, and through amplifier-limiter stage 11. The output 13 of the limiter couples to a frequency demodulator 15, which, in this embodiment, is a modulation-tracking phase locked loop comprising VCO 151, phase detector 153, and loop filter 155. The demodulated output appears at 17.

The output 13 from limiter 11 also provides a signal to a phase locked loop that controls the local oscillator VCO 3. VCO 3 could be a free-running oscillator, a frequency synthesizer, or a crystal oscillator and must have direct FM capability. The oscillator or synthesizer would be initially tuned to approximately the correct frequency to convert the desired received signal to the IF, after which the phase-locked loop would steer the oscillator to the correct frequency to develop the desired IF. The loop comprises input divider 19, reference oscillator 21, phase detector 25, loop filter 27, VCO 3, mixer 5, and IF bandpass filter 7. The loop causes the LO to track the received signal to maintain the IF output 6 at a predetermined frequency equal to the divider ratio (N) times the loop reference frequency ($F_{ref}$) from oscillator 21.

By causing the local oscillator to follow variations of the carrier at rates within the loop bandwidth, the loop removes low-frequency modulation information from the IF signal. Consequently, the demodulated output at 17 has greatly attenuated low-frequency content; primarily, high frequency modulation components appear. However, the VCO control signal reproduces those low-frequency components. The full spectrum, "flat" demodulated output can be obtained by combining the low-frequency information at 29 with the high-frequency information at 17 in summing network 35 with weighting provided by gain constants 31 and 33, respectively. The combining network may be an operational amplifier or similar circuit that can individually scale and sum two analog inputs. The weighting factors $K_1$ and $K_2$ account for the voltage-to-frequency conversion factor of the VCO in the carrier tracking loop and the frequency-to-voltage conversion factor of the demodulator and are adjusted to equally weight the low- and high-frequency components. The demodulated output available at 37 will then extend from DC to the half-bandwidth of the IF filter or the bandwidth of the demodulator, whichever is narrower.

The properties of phase locked loops are well known, and the reader is referred to the standard texts, such as Gardner, F. M., *Phaselock Techniques*, New York: Wiley, 2d ed. 1979, for greater detail. However, several features particular to this receiver are noteworthy. First, the loop should be type one, where "type" refers to the number of poles located at the origin in the open-loop transfer function. A type two or higher loop would cause the local oscillator to pull towards an off-channel interfering signal, which would severely degrade reception of an on-channel signal. Because the VCO inherently provides a pole at the origin, the loop filter must contain no integrators. Second, the loop should have a predominately first-order response. The closed loop response depends on the loop gain and the dynamics of the loop and IF filters. The loop gain should be relatively low, and the bandwidths of these filters should be relatively wide compared to the closed-loop bandwidth, so that the gain will predominate and cause a first-order response. The IF and loop filters will provide non-dominant poles, and their extra phase shift will not affect loop stability. Although the loop filter should be somewhat wide, some filtering must be provided to prevent high frequency noise at the output of the phase detector from modulating the VCO. On reception of weak signals, noise appears at the limiter output and would create noise sidebands on the injection oscillator if not filtered. These sidebands could mix with strong adjacent-channel interfering signals, convert noise into the IF passband, and degrade sensitivity to desired, on-channel signals. Third, because a carrier-tracking loop does not follow the high-frequency phase deviations in the IF signal, a frequency divider (19) is needed to keep the peak phase deviation within the operating range of the phase detector. Also, if the desired signal may be outside the loop capture range initially, the receiver must include a mechanism to acquire the signal. One mechanism would be a phase-frequency detector able to respond to a difference in frequency between the signal and reference inputs and to steer the VCO to acquire lock; another would be a VCO sweep circuit.

Figure 2:
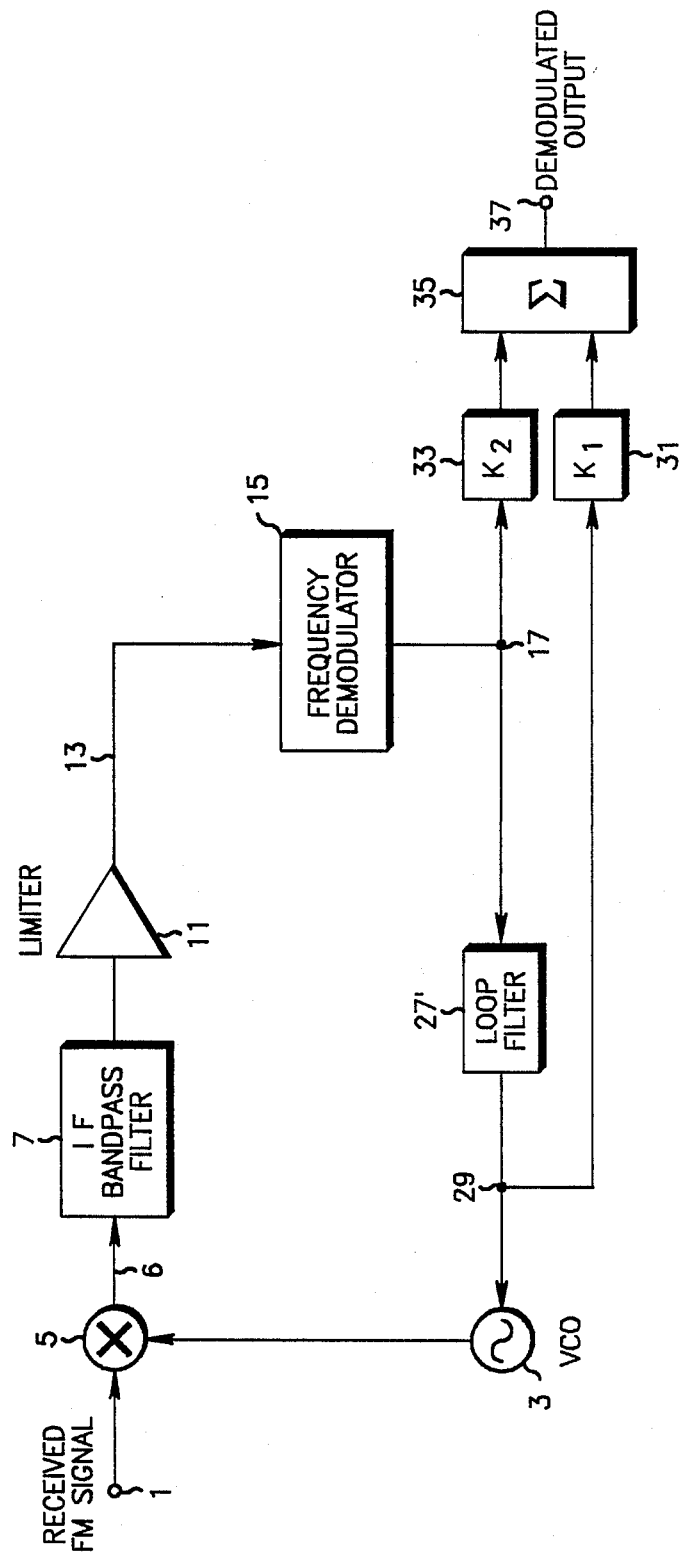
FIG. 2 is a block diagram of an FM receiver that uses automatic frequency control and that recovers modulation according to the principles of the invention.

The principles of the invention may also be applied to an FM receiver that has AFC control, as shown in FIG. 2. This receiver accepts an FM signal at 1 and converts it to IF signal 6 in mixer 5, using an LO signal from VCO 3. After conventional IF processing in filter 7 and limiter 11, the IF signal at 13 drives a frequency demodulator 15, which provides an output voltage proportional to the instantaneous deviation of the IF frequency from the predetermined IF center frequency. The output of the demodulator couples to the AFC loop, which is a negative feedback system that minimizes the error in the IF frequency. Loop filter 27' removes high-frequency variations, and its output drives the VCO to minimize the residual frequency error measured by the demodulator.

In minimizing static errors and low frequency variations in the IF frequency, the AFC loop greatly attenuates the components of the demodulated signal 17 at frequencies within the loop bandwidth. However, VCO control signal 29 provides this low-frequency modulation information. As before, the low- and high-frequency components from 29 and 17, respectively, combine in summing network 35 with proper weighting provided by gain constants 31 and 33 to produce flat demodulated output at 37.

Figure 3:
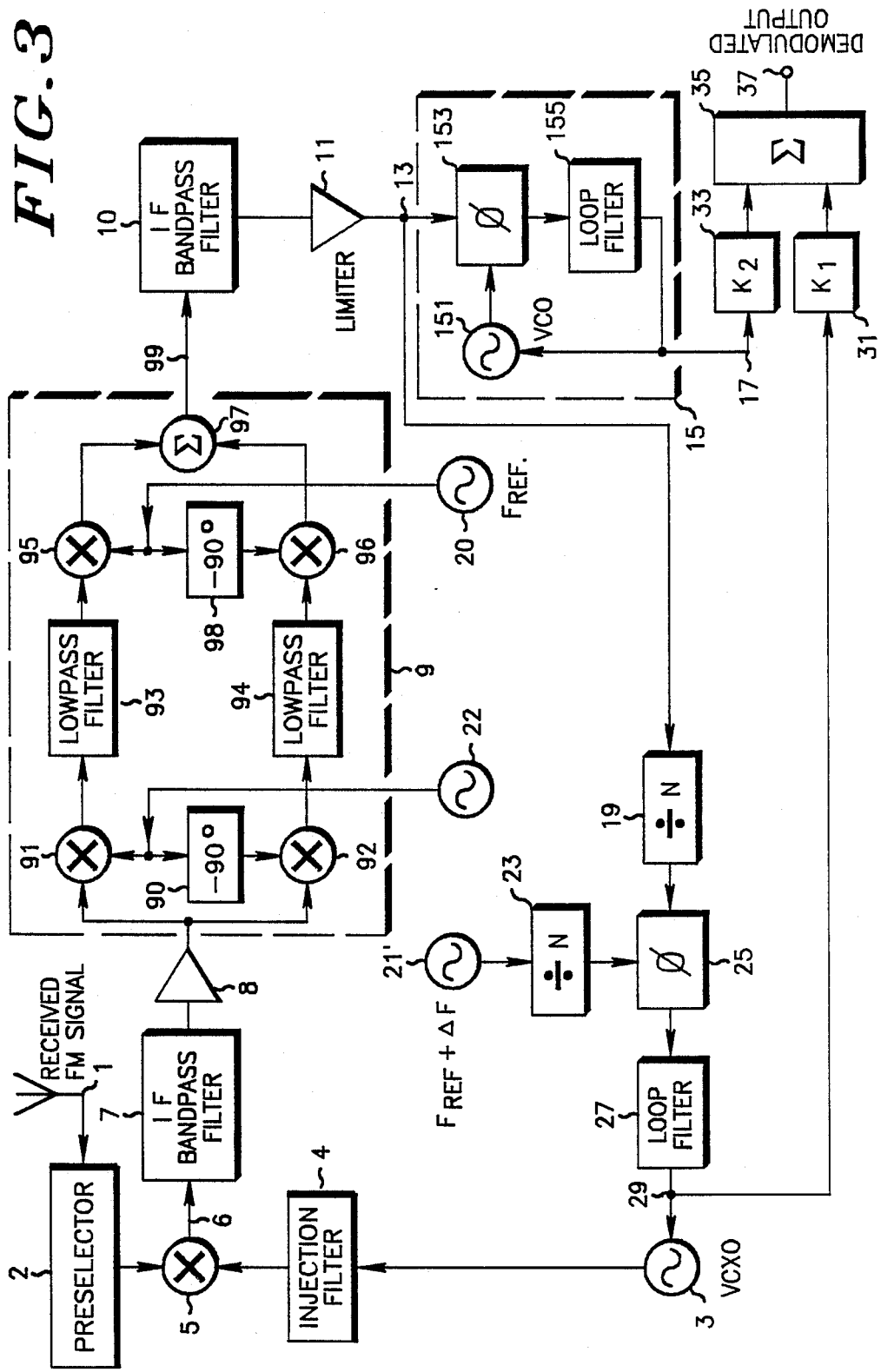
FIG. 3 is a block diagram of a more complex FM receiver that demodulates according to the principles of the invention and that includes triple conversion with a phase-locked first local oscillator, direct conversion to a baseband, zero-IF by a fixed second LO, up-conversion to a third IF for demodulation, and additional front end structure for preselection of incoming signals and injection filtering of the first LO.

To further illustrate the application of the invention to modern communications receivers, FIG. 3 shows an embodiment of the invention as it would appear in a direct conversion FM receiver. The receiver signal from the antenna at 1 goes through preselector 2, which restricts the band of signals at the input of mixer 5 and prevents those at the image frequency from being converted into the IF. Injection filter 4 removes sideband noise and spurious signals from the local oscillator signal coupled to the mixer. This receiver uses a voltage-controlled crystal oscillator (VCXO), which is a stable oscillator with DC coupled frequency modulation capability. The oscillator frequency would be selected to convert the desired carrier frequency into the IF; the carrier tracking loop then provides the fine-tuning voltage needed to precisely center the IF.

In a somewhat different manner than in the receivers of FIGS. 1 and 2, IF signal 6 from the first conversion mixer 5 receives IF filtering and gain (7 and 8) and then couples to direct conversion IF stage 9. The IF signal couples to quadrature paths 91-93-95 and 92-94-96, which each comprise a down-conversion mixer, a low-pass filter, and an up-conversion mixer. The quadrature outputs combine in summing stage 97 to provide a filtered, third IF signal at 99. Fixed oscillator 22 and phase shifter 90 provide the down conversion signals; reference oscillator 20 and phase shifter 98 provide the up-conversion signals.

The IF signal at 99 follows a path similar to that in the receiver of FIG. 1. IF bandpass filter 10 couples to limiter 11 and provides limited IF signal 13, which goes to a phase locked loop demodulator 15 that provides output at 17.

The limited IF signal 13 and an offset reference from oscillator 21' couple to phase detector 25 through frequency dividers 19 and 23, respectively. As noted in connection with FIG. 1, the IF divider prevents the phase deviation from exceeding the range of the phase detector. A similar divider is provided in the reference path to allow the offset reference oscillator to have its frequency and offset referred to the up-conversion oscillator 20. The purpose of the reference offset is to shift the baseband IF signal slightly away from zero frequency (DC) to avoid the need to DC couple the baseband circuits. The phase lock system maintains this precise offset frequency, which is below the lowest expected modulation frequency. Any beat note that may arise from imperfect matching of the quadrature paths can then easily be suppressed by highpass coupling. To complete the carrier tracking loop, the phase detector output couples to loop filter 27 and drives the VCXO.

The receiver recovers modulation as in the examples above. The low-frequency recovered demodulation signal, which appears at VCXO control 29, combines with the high-frequency demodulation signal 17 from the frequency demodulator. Summing network 35, with weighting inputs 31 and 33, provides flat recovered modulation at output 37.

The invention has been disclosed in connection with the particular embodiments described above, but it is understood that the novelty lies in the recovery of frequency modulation information with flat frequency response by combining low frequency modulation information derived from a local oscillator control loop with high frequency modulation information derived from a conventional FM demodulator. The scope of the invention as claimed includes modifications and additional applications that will be apparent to those skilled in the art.

I claim:

1. A receiver for recovering modulation signals frequency modulated on a received carrier signal, comprising:
   frequency conversion means for converting the carrier frequency of the received signal to an intermediate frequency and producing an intermediate frequency signal, the frequency conversion means including carrier tracking means for
   producing a low frequency recovered modulation signal substantially proportional to static errors and slow variations in the carrier signal;
   frequency demodulation means for recovering the frequency modulation information carried by the intermediate frequency signal and producing a high frequency recovered modulation signal; and
   combining means for weighting and combining the low frequency and high frequency recovered modulation signals and producing a recovered modulation signal with substantially flat frequency response.

2. The receiver of claim 1 in which the carrier tracking means comprises a phase locked loop.

3. The receiver of claim 1 in which the carrier tracking means comprises an automatic frequency control (AFC) loop.

4. The receiver of claim 1 in which the frequency demodulation means comprises a modulation-tracking phase locked loop.

5. The receiver of claim 1 in which the frequency demodulation means comprises a frequency discriminator.

6. The receiver of claim 1 in which the frequency conversion means includes direct conversion means for converting the received signal to a baseband, zero intermediate frequency.

7. The method for recovering modulation signals frequency modulated on a received carrier signal, comprising the steps of:
   converting the carrier frequency of the received signal to an intermediate frequency and producing an intermediate frequency signal;
   producing a low frequency recovered modulation signal substantially proportional to static errors and slow variations in the carrier signal;
   recovering the frequency modulation information carried by the intermediate frequency signal and producing a high frequency recovered modulation signal; and
   weighting and combining the low frequency and high frequency recovered modulation signals and producing a recovered modulation signal with substantially flat frequency response.

8. The method of claim 7 in which the step of converting the carrier frequency of the received signal to an intermediate frequency includes the step of converting the received signal to a baseband, zero intermediate frequency.

* * * * *